(12) United States Patent
Hyde

(10) Patent No.: US 10,819,319 B1
(45) Date of Patent: Oct. 27, 2020

(54) LEVEL SHIFTER CIRCUIT WITH SELF-GATED TRANSITION AMPLIFIER

(71) Applicant: Impinj, Inc., Seattle, WA (US)

(72) Inventor: John D. Hyde, Corvallis, OR (US)

(73) Assignee: Impinj, Inc., Seattle, WA (US)

( * ) Notice: Subject to any disclaimer, the term of this patent is extended or adjusted under 35 U.S.C. 154(b) by 0 days.

(21) Appl. No.: 16/689,171

(22) Filed: Nov. 20, 2019

Related U.S. Application Data

(60) Provisional application No. 62/769,954, filed on Nov. 20, 2018.

(51) Int. Cl.
| | |
|---|---|
| *H03K 3/35* | (2006.01) |
| *G06K 19/07* | (2006.01) |
| *H03K 3/356* | (2006.01) |
| *H03K 19/0185* | (2006.01) |

(52) U.S. Cl.
CPC ... *H03K 3/356113* (2013.01); *G06K 19/0715* (2013.01); *G06K 19/0723* (2013.01); *H03K 19/018521* (2013.01)

(58) Field of Classification Search
CPC ..... H03K 3/356113; H03K 19/018521; G06K 19/0715; G06K 19/0723
See application file for complete search history.

(56) References Cited

U.S. PATENT DOCUMENTS

| | | | | |
|---|---|---|---|---|
| 5,936,432 A * | 8/1999 | Oh | ................. | G11C 7/062 327/52 |
| 6,556,047 B2 * | 4/2003 | Debaty | ............ | H03K 3/356113 326/68 |
| 7,148,735 B2 * | 12/2006 | Ito | ................. | H03K 3/011 327/333 |
| 7,382,172 B2 * | 6/2008 | Lin | ................. | H03K 3/012 326/64 |
| 7,436,213 B2 * | 10/2008 | Nojiri | ................. | H03K 3/012 326/68 |
| 7,714,613 B2 * | 5/2010 | Mori | ................. | H03K 3/356113 326/63 |
| 7,746,147 B2 * | 6/2010 | Kiritani | ................. | H03K 19/018521 326/63 |

(Continued)

OTHER PUBLICATIONS

Chang, et al. "A Low-Power Subthreshold-to-Superthreshold Level-Shifter for Sub-0.5V Embedded Resistive RAM (ReRAM) Macro in Ultra Low-Voltage Chips" IEEE 2014.

(Continued)

*Primary Examiner* — Vibol Tan
(74) *Attorney, Agent, or Firm* — Hertzberg, Turk & Associates, LLC

(57) ABSTRACT

A level shifter circuit configured to convert a digital input signal with a first high logic level to a digital output signal having a second high logic level substantially higher than the first high logic level is provided. The level shifter circuit may include a PMOS latch circuit configured to receive the digital input signal and having first and second latch outputs and a current mirror circuit having a mirror input and a mirror output. The mirror input may be at least partly gated by a switch having a control input. The mirror output may be coupled to the first latch output. The control input may be coupled to the first or second latch outputs, and the digital output signal is provided from the first and/or second latch outputs.

16 Claims, 9 Drawing Sheets

(56) References Cited

U.S. PATENT DOCUMENTS

| | | | | |
|---|---|---|---|---|
| 7,834,661 | B2* | 11/2010 | Ku | H03K 19/018571 |
| | | | | 326/68 |
| 8,282,964 | B2* | 10/2012 | Gallagher | A61K 38/21 |
| | | | | 424/534 |
| 8,653,877 | B2 | 2/2014 | Wu et al. | |
| 9,059,700 | B2* | 6/2015 | Viani | H03K 19/018507 |
| 10,103,732 | B1* | 10/2018 | Bill | H03K 19/018521 |
| 10,284,081 | B2* | 5/2019 | Rebollo Pimentel | H02M 3/07 |
| 10,536,147 | B1* | 1/2020 | Kumar | G11C 11/407 |

OTHER PUBLICATIONS

Haga and Kale "Bulk-Driven DC Level Shifter" IEEE 2011.

Hasanbegovic and Aunet "Low-Power Subthreshold to Above Threshold Level Shifter in 90 nm Process" IEEE 2009.

Hosseini, et al. "A Low-Power Subthreshold to Above-Threshold Voltage Level Shifter" IEEE Transactions on Circuits and Systems—II: Express Briefs, vol. 61, No. 10, Oct. 2014.

Huang and Chiou "A Limited-Contention Cross-Coupled Level Shifter for Energy-Efficient Subthreshold-to-Superthreshold Voltage Conversion" IEEE ISOCC 2014.

Liu, et al. "A New Circuit Topology for Floating High Voltage Level Shifters" IEEE 2014.

Liu, et al. "Design of 370 ps Delay Floating Voltage Level Shifters with 30 V/ns Power Supply Slew Tolerance" IEEE 2015.

Luo, et al. "A Wide-Range Level Shifter Using a Modified Wilson Current Mirror Hybrid Buffer" IEEE Transactions on Circuits and Systems—I: Regular Papers, vol. 61, No. 6, Jun. 2014.

Lutkemeier and Ruckert "A Subthreshold to Above-Threshold Level Shifter Comprising a Wilson Current Mirror" IEEE Transactions on Circuits and Systems—II: Express Briefs, vol. 57, No. 9, Sep. 2010.

Wen, et al. "Subthreshold Level Shifter With Self-Controlled Current Limiter by Detecting Output Error" IEEE Transactions on Circuits and Systems—II: Express Briefs, vol. 63, No. 4, Apr. 2016.

Wooters, et al. "An Energy-Efficient Subthreshold Level Converter in 130-nm CMOS" IEEE Transactions on Circuits and Systems—II: Express Briefs, vol. 57, No. 4, Apr. 2010.

Zhou, et al. "A Fast and Energy-Efficient Level Shifter with Wide Shifting Range from Sub-threshold up to I/O Voltage" IEEE Asian Solid-State Circuits Conference 2013.

Zhou, et al. "An Ultra-Low Voltage Level Shifter Using Revised Wilson Current Mirror for Fast and Energy-Efficient Wide-Range Voltage Conversion from Sub-Threshold to I/O Voltage" IEEE Transactions on Circuits and Systems—I: Regular Papers, vol. 62, No. 3, Mar. 2015.

* cited by examiner

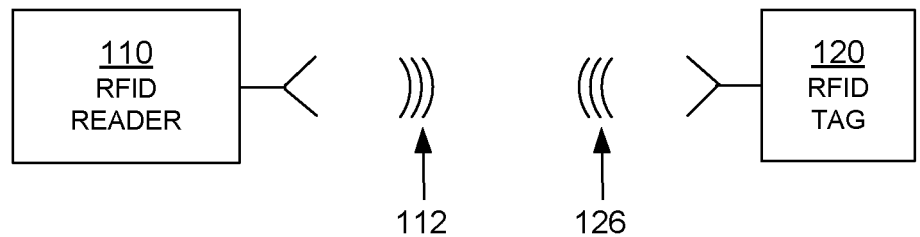
FIG. 1
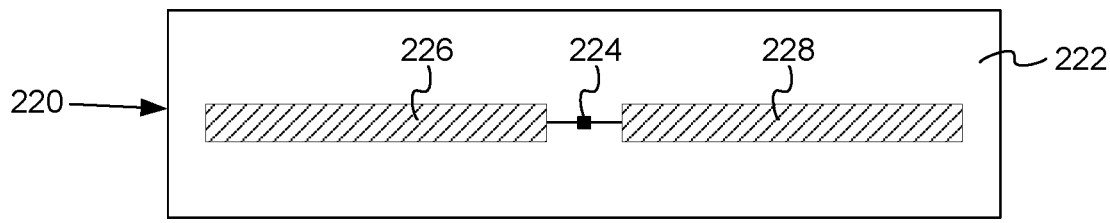
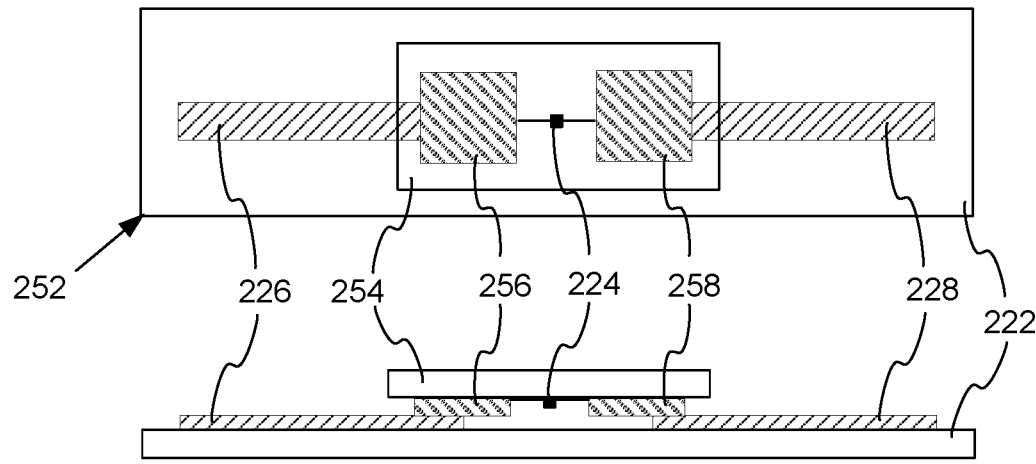
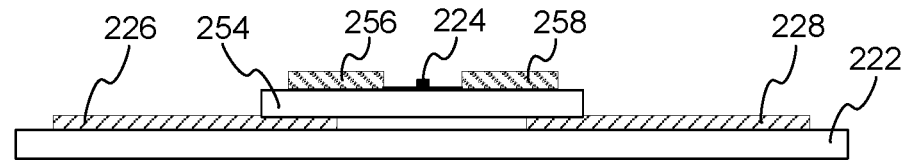
FIG. 2

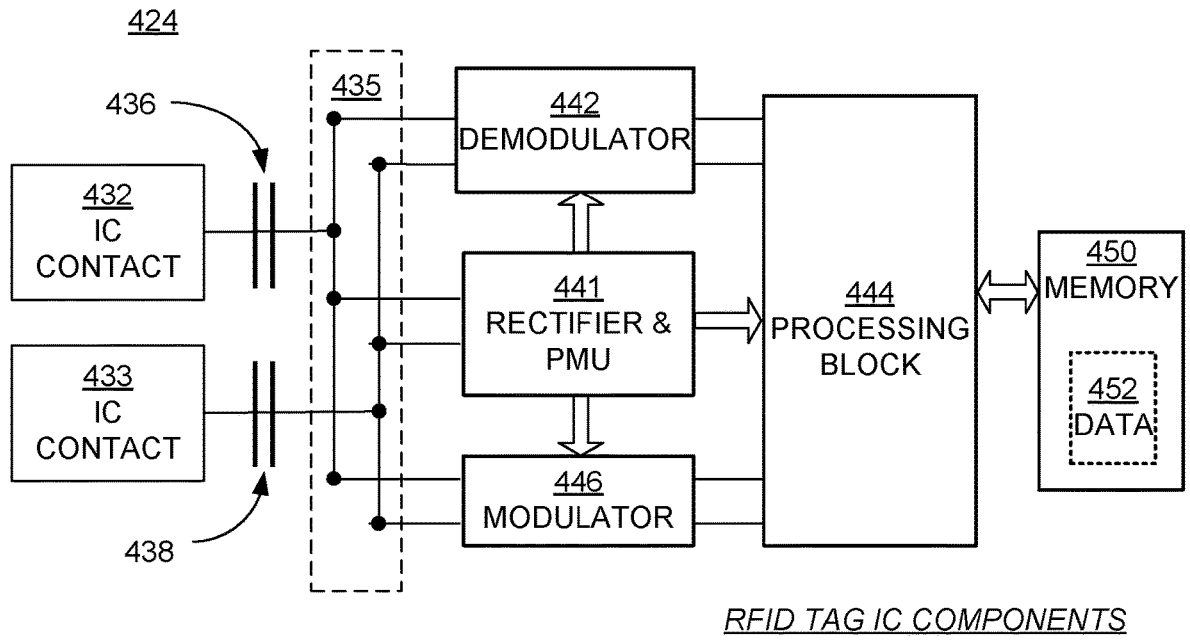
FIG. 4
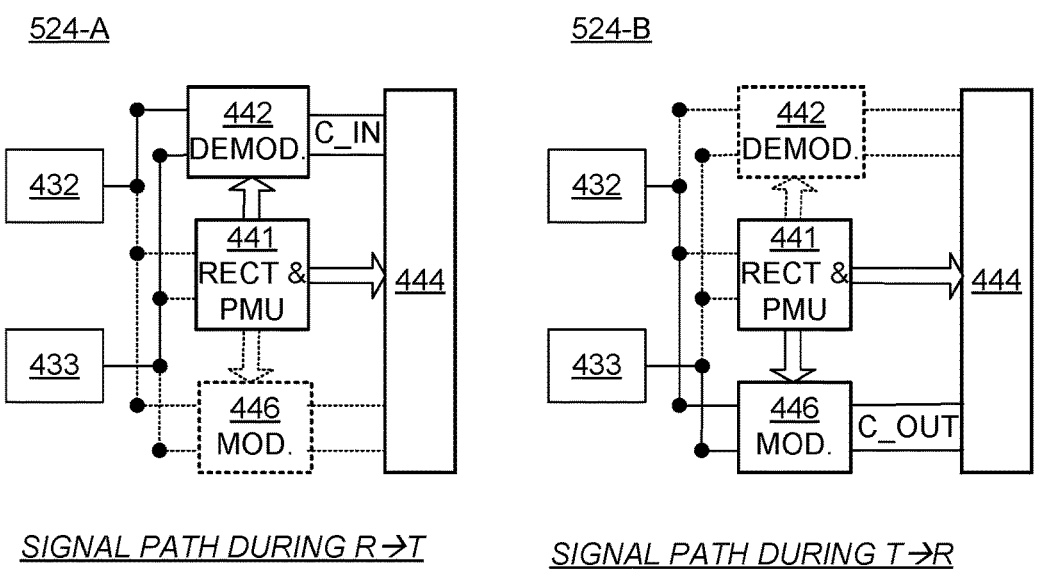
FIG. 5A  FIG. 5B

LEVEL SHIFTER CIRCUIT WITH SELF-GATED TRANSITION AMPLIFIER

CROSS REFERENCE TO RELATED APPLICATIONS

This application claims the benefit of U.S. Provisional Patent Application Ser. No. 62/769,954 filed on Nov. 20, 2018. The disclosures of the above application are hereby incorporated by reference for all purposes.

BACKGROUND

Radio-Frequency Identification (RFID) systems typically include RFID readers, also known as RFID reader/writers or RFID interrogators, and RFID tags. RFID systems can be used in many ways for locating and identifying objects to which the tags are attached. RFID systems are useful in product-related and service-related industries for tracking objects being processed, inventoried, or handled. In such cases, an RFID tag is usually attached to an individual item, or to its package. The RFID tag typically includes, or is, a radio-frequency (RF) integrated circuit (IC).

In principle, RFID techniques entail using an RFID reader to inventory one or more RFID tags, where inventorying involves singulating a tag, receiving an identifier from a tag, and/or acknowledging a received identifier (e.g., by transmitting an acknowledge command). "Singulated" is defined as a reader singling-out one tag, potentially from among multiple tags, for a reader-tag dialog. "Identifier" is defined as a number identifying the tag or the item to which the tag is attached, such as a tag identifier (TID), electronic product code (EPC), etc. An "inventory round" is defined as a reader staging RFID tags for successive inventorying. The reader transmitting an RF wave performs the inventory. The RF wave is typically electromagnetic, at least in the far field. The RF wave can also be predominantly electric or magnetic in the near or transitional near field. The RF wave may encode one or more commands that instruct the tags to perform one or more actions. The operation of an RFID reader sending commands to an RFID tag is sometimes known as the reader "interrogating" the tag.

In typical RFID systems, an RFID reader transmits a modulated RF inventory signal (a command), receives a tag reply, and transmits an RF acknowledgement signal responsive to the tag reply. A tag that replies to the interrogating RF wave does so by transmitting back another RF wave. The tag either generates the transmitted back RF wave originally, or by reflecting back a portion of the interrogating RF wave in a process known as backscatter. Backscatter may take place in a number of ways.

The reflected-back RF wave may encode data stored in the tag, such as a number. The response is demodulated and decoded by the reader, which thereby identifies, counts, or otherwise interacts with the associated item. The decoded data can denote a serial number, a price, a date, a time, a destination, an encrypted message, an electronic signature, other attribute(s), any combination of attributes, and so on. Accordingly, when a reader receives tag data it can learn about the item that hosts the tag and/or about the tag itself.

An RFID tag typically includes an antenna section, a radio section, a power-management section, and frequently a logical section, a memory, or both. In some RFID tags the power-management section includes an energy storage device such as a battery. RFID tags with an energy storage device are known as battery-assisted, semi-active, or active tags. Other RFID tags can be powered solely by the RF signal they receive. Such RFID tags do not include an energy storage device and are called passive tags. Of course, even passive tags typically include temporary energy- and data/flag-storage elements such as capacitors or inductors.

BRIEF SUMMARY

This summary is provided to introduce a selection of concepts in a simplified form that are further described below in the Detailed Description. This summary is not intended to identify key features or essential features of the claimed subject matter, nor is it intended as an aid in determining the scope of the claimed subject matter.

Embodiments are directed to a level shifter circuit configured to convert a digital input signal with a first high logic level to a digital output signal having a second high logic level substantially higher than the first high logic level. The level shifter circuit may include a PMOS latch circuit configured to receive the digital input signal and having first and second latch outputs and a current mirror circuit having a mirror input and a mirror output. The mirror input may be at least partly gated by a switch having a control input. The mirror output may be coupled to the first latch output. The control input may be coupled to the first or second latch outputs, and the digital output signal is provided from the first and/or second latch outputs.

According to one example, a level shifter circuit configured to convert a first digital input signal having a first high logic level to a digital output signal having a second high logic level substantially higher than the first high logic level is provided. The level shifter circuit includes a latch circuit and a current mirror circuit. The latch circuit may be at least partly controlled by the first digital input signal and includes first and second PMOS transistors. A gate of the first PMOS transistor may be coupled to a drain of the second PMOS transistor and a gate of the second PMOS transistor may be coupled to a drain of the first PMOS transistor. The current mirror circuit may be at least partly controlled by the first digital input signal and may include third and fourth PMOS transistors and a first NMOS transistor. The current mirror circuit may be configured to receive an input current coupled to a drain of the third PMOS transistor and to provide an output current at a drain of the fourth PMOS transistor and the drain of the first PMOS transistor. The first NMOS transistor may be configured to switch the input current. A gate of the first NMOS transistor may be coupled to the drain of the second PMOS transistor, and the drain of the first PMOS transistor or the drain of the second PMOS transistor may be used to generate the digital output signal.

According to another example, a level shifter circuit configured to convert a digital input signal having a first high logic level to a digital output signal having a second high logic level substantially higher than the first high logic level is provided. The level shifter circuit may include a PMOS latch circuit and a first current mirror circuit. The PMOS latch circuit may be configured to receive the digital input signal and may include first and second latch outputs. The first current mirror circuit may have a first mirror input and a first mirror output. The first mirror input may be partly gated by a first switch having a first control input. The first mirror output may be coupled to the first latch output. The first control input may be coupled to the first or the second latch outputs. The digital output signal may be generated from the first and/or the second latch outputs.

According to yet another example, a method to convert a digital input signal having a first high logic level to a digital output signal having a second high logic level substantially higher than the first high logic level is provided. The method may include providing the digital input signal to a PMOS latch circuit configured to transition between providing the digital output signal having the second high logic level and providing a digital output signal having a low logic level. The method may further include using a PMOS current mirror circuit to assist the PMOS latch circuit during the transition. The current mirror circuit may be parallel to the PMOS latch circuit and may be configured to conduct substantial current only during the transition and otherwise not conductive substantial current. When conducting substantial current, the current mirror circuit may be configured to use the substantial current to assist the PMOS latch circuit to transition by providing the second high logic level on a first side of the PMOS latch circuit.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The following Detailed Description proceeds with reference to the accompanying drawings, in which:

FIG. 1 is a block diagram of components of an RFID system.

FIG. 2 is a diagram showing components of a passive RFID tag, such as a tag that can be used in the system of FIG. 1.

FIG. 4 is a block diagram showing a detail of an RFID tag, such as the one shown in FIG. 2.

FIGS. 5A and 5B illustrate signal paths during tag-to-reader and reader-to-tag communications in the block diagram of FIG. 4.

DETAILED DESCRIPTION

Figure 3:
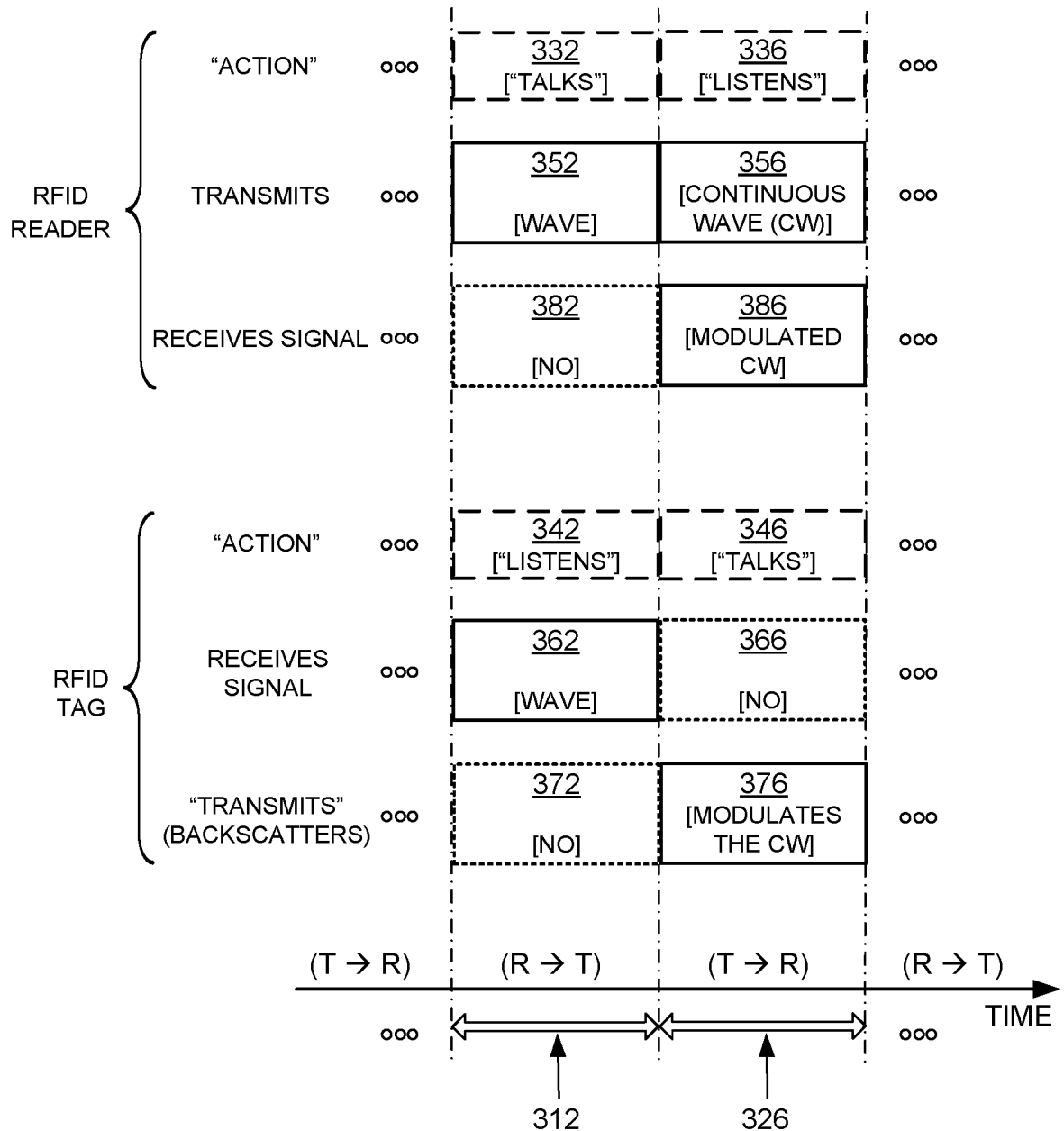
FIG. 3 is a conceptual diagram for explaining a half-duplex mode of communication between the components of the RFID system of FIG. 1.

In the following detailed description, references are made to the accompanying drawings that form a part hereof, and in which are shown by way of illustration specific embodiments or examples. These embodiments or examples may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

As used herein, "memory" is one of ROM, RAM, SRAM, DRAM, NVM, EEPROM, FLASH, Fuse, MRAM, FRAM, and other similar volatile and nonvolatile information-storage technologies. Some portions of memory may be writeable and some not. "Instruction" refers to a request to a tag to perform a single explicit action (e.g., write data into memory). "Command" refers to a reader request for one or more tags to perform one or more actions, and includes one or more tag instructions preceded by a command identifier or command code that identifies the command and/or the tag instructions. "Program" refers to a request to a tag to perform a set or sequence of instructions (e.g., read a value from memory and, if the read value is less than a threshold then lock a memory word). "Protocol" refers to an industry standard for communications between a reader and a tag (and vice versa), such as the Class-1 Generation-2 UHF RFID Protocol for Communications at 860 MHz-960 MHz by GS1 EPCglobal, Inc. ("Gen2 Protocol"), versions 1.2.0 and 2.0 of which are hereby incorporated by reference.

FIG. 1 is a diagram of the components of a typical RFID system 100, incorporating embodiments. An RFID reader 110 and a nearby RFID tag 120 communicate via RF signals 112 and 126. When sending data to tag 120, reader 110 may generate RF signal 112 by encoding the data, modulating an RF waveform with the encoded data, and transmitting the modulated RF waveform as RF signal 112. In turn, tag 120 may receive RF signal 112, demodulate encoded data from RF signal 112, and decode the encoded data. Similarly, when sending data to reader 110 tag 120 may generate RF signal 126 by encoding the data, modulating an RF waveform with the encoded data, and causing the modulated RF waveform to be sent as RF signal 126. The data sent between reader 110 and tag 120 may be represented by symbols, also known as RFID symbols. A symbol may be a delimiter, a calibration value, or implemented to represent binary data, such as "0" and "1", if desired. Upon processing by reader 110 and tag 120, symbols may be treated as values, numbers, or any other suitable data representations.

The RF waveforms transmitted by reader 110 and/or tag 120 may be in a suitable range of frequencies, such as those near 900 MHz, 13.56 MHz, or similar. In some embodiments, RF signals 112 and/or 126 may include non-propagating RF signals, such as reactive near-field signals or similar. RFID tag 120 may be active or battery-assisted (i.e., possessing its own power source), or passive. In the latter case, RFID tag 120 may harvest power from RF signal 112.

FIG. 2 is a diagram of an RFID tag 220, which may function as tag 120 of FIG. 1. Tag 220 may be formed on a substantially planar inlay 222, which can be made in any suitable way. Tag 220 includes a circuit which may be implemented as an IC 224. In some embodiments IC 224 is fabricated in complementary metal-oxide semiconductor (CMOS) technology. In other embodiments IC 224 may be fabricated in other technologies such as bipolar junction transistor (BJT) technology, metal-semiconductor field-effect transistor (MESFET) technology, and others as will be well known to those skilled in the art. IC 224 is arranged on inlay 222.

Tag 220 also includes an antenna for transmitting and/or interacting with RF signals. In some embodiments the antenna can be etched, deposited, and/or printed metal on inlay 222; conductive thread formed with or without substrate 222; nonmetallic conductive (such as graphene) patterning on substrate 222; a first antenna coupled inductively, capacitively, or galvanically to a second antenna; or can be fabricated in myriad other ways that exist for forming antennas to receive RF waves. In some embodiments the antenna may even be formed in IC 224. Regardless of the antenna type, IC 224 is electrically coupled to the antenna via suitable IC contacts (not shown in FIG. 2). "Coupled" as used herein may mean a direct connection, or it may mean a connection that includes one or more intervening circuit blocks, elements, or devices. The "electrical" part of the term "electrically coupled" as used in this document shall mean a coupling that is one or more of ohmic/galvanic, capacitive, and/or inductive. Similarly, the terms "electrically isolated" or "electrically decoupled" as used herein mean that electrical coupling of one or more types (e.g., galvanic, capacitive, and/or inductive) is not present, at least to the extent possible. For example, elements that are electrically isolated from each other are galvanically isolated from each other, capacitively isolated from each other, and/or inductively isolated from each other. Of course, electrically isolated components will generally have some unavoidable stray capacitive or inductive coupling between them, but the intent of the isolation is to minimize this stray coupling when compared with an electrically coupled path.

IC 224 is shown with a single antenna port, comprising two IC contacts electrically coupled to two antenna segments 226 and 228 which are shown here forming a dipole. Many other embodiments are possible using any number of ports, contacts, antennas, and/or antenna segments. Antenna segments 226 and 228 are depicted as separate from IC 224, but in other embodiments the antenna segments may alternatively be formed on IC 224. Tag antennas according to embodiments may be designed in any form and are not limited to dipoles. For example, the tag antenna may be a patch, a slot, a loop, a coil, a horn, a spiral, a monopole, microstrip, stripline, or any other suitable antenna.

Diagram 250 depicts top and side views of tag 252, formed using a strap. Tag 252 differs from tag 220 in that it includes a substantially planar strap substrate 254 having strap contacts 256 and 258. IC 224 is mounted on strap substrate 254 such that the IC contacts on IC 224 electrically couple to strap contacts 256 and 258 via suitable connections (not shown). Strap substrate 254 is then placed on inlay 222 such that strap contacts 256 and 258 electrically couple to antenna segments 226 and 228. Strap substrate 254 may be affixed to inlay 222 via pressing, an interface layer, one or more adhesives, or any other suitable means.

Diagram 260 depicts a side view of an alternative way to place strap substrate 254 onto inlay 222. Instead of strap substrate 254's surface, including strap contacts 256/258, facing the surface of inlay 222, strap substrate 254 is placed with its strap contacts 256/258 facing away from the surface of inlay 222. Strap contacts 256/258 can then be either capacitively coupled to antenna segments 226/228 through strap substrate 254, or conductively coupled using a through-via which may be formed by crimping strap contacts 256/258 to antenna segments 226/228. In some embodiments, the positions of strap substrate 254 and inlay 222 may be reversed, with strap substrate 254 mounted beneath inlay 222 and strap contacts 256/258 electrically coupled to antenna segments 226/228 through inlay 222. Of course, in yet other embodiments strap contacts 256/258 may electrically couple to antenna segments 226/228 through both inlay 222 and strap substrate 254.

In operation, the antenna couples with RF signals in the environment and propagates the signals to IC 224, which may both harvest power and respond if appropriate, based on the incoming signals and the IC's internal state. If IC 224 uses backscatter modulation then it may generate a response signal (e.g., signal 126) from an RF signal in the environment (e.g., signal 112) by modulating the antenna's reflectance. Electrically coupling and uncoupling the IC contacts of IC 224 can modulate the antenna's reflectance, as can varying the admittance or impedance of a shunt-connected or series-connected circuit element which is coupled to the IC contacts. If IC 224 is capable of transmitting signals (e.g., has its own power source, is coupled to an external power source, and/or can harvest sufficient power to transmit signals), then IC 224 may respond by transmitting response signal 126. In the embodiments of FIG. 2, antenna segments 226 and 228 are separate from IC 224. In other embodiments, the antenna segments may alternatively be formed on IC 224.

An RFID tag such as tag 220 is often attached to or associated with an individual item or the item packaging. An RFID tag may be fabricated and then attached to the item or packaging, may be partly fabricated before attachment to the item or packaging and then completely fabricated upon attachment to the item or packaging, or the manufacturing process of the item or packaging may include the fabrication of the RFID tag. In some embodiments, the RFID tag may be integrated into the item or packaging. In this case, portions of the item or packaging may serve as tag components. For example, conductive item or packaging portions may serve as tag antenna segments or contacts. Nonconductive item or packaging portions may serve as tag substrates or inlays. If the item or packaging includes integrated circuits or other circuitry, some portion of the circuitry may be configured to operate as part or all of an RFID tag IC. Thus, an "RFID IC" need not be distinct from an item, but more generally refers to the item containing an RFID IC and antenna capable of interacting with RF waves and receiving and responding to RFID signals. Because the boundaries between IC, tag, and item are thus often blurred, the terms "RFID IC", "RFID tag", "tag", or "tag IC" as used herein may refer to the IC, the tag, or even to the item as long as the referenced element is capable of RFID functionality.

The components of the RFID system of FIG. 1 may communicate with each other in any number of modes. One such mode is called full duplex, where both reader 110 and tag 120 can transmit at the same time. In some embodiments, RFID system 100 may be capable of full duplex communication. Another such mode, which may be more suitable for passive tags, is called half-duplex, and is described below.

FIG. 3 is a conceptual diagram 300 for explaining half-duplex communications between the components of the RFID system of FIG. 1, in this case with tag 120 implemented as a passive tag. The explanation is made with reference to a TIME axis, and also to a human metaphor of "talking" and "listening". The actual technical implementations for "talking" and "listening" are now described.

In a half-duplex communication mode, RFID reader 110 and RFID tag 120 talk and listen to each other by taking turns. As seen on axis TIME, reader 110 talks to tag 120 during intervals designated "R→T", and tag 120 talks to reader 110 during intervals designated "T→R". For example, a sample R→T interval occurs during time interval 312, during which reader 110 talks (block 332) and tag 120 listens (block 342). A following sample T→R interval occurs during time interval 326, during which reader 110 listens (block 336) and tag 120 talks (block 346). Interval 312 may be of a different duration than interval 326—here the durations are shown approximately equal only for purposes of illustration.

During interval 312, reader 110 transmits a signal such as signal 112 described in FIG. 1 (block 352), while tag 120 receives the reader signal (block 362), processes the reader signal to extract data, and harvests power from the reader signal. While receiving the reader signal, tag 120 does not backscatter (block 372), and therefore reader 110 does not receive a signal from tag 120 (block 382).

During interval 326, also known as a backscatter time interval or backscatter interval, reader 110 does not transmit a data-bearing signal. Instead, reader 110 transmits a continuous wave (CW) signal, which is a carrier that generally does not encode information. The CW signal provides energy for tag 120 to harvest as well as a waveform that tag 120 can modulate to form a backscatter response signal. Accordingly, during interval 326 tag 120 is not receiving a signal with encoded information (block 366) and instead modulates the CW signal (block 376) to generate a backscatter signal such as signal 126 described in FIG. 2. Tag 120 may modulate the CW signal to generate a backscatter signal by adjusting its antenna reflectance, as described above. Reader 110 then receives and processes the backscatter signal (block 386).

FIG. 4 is a block diagram showing a detail of an RFID IC, such as IC 224 in FIG. 2. Electrical circuit 424 may be implemented in an IC, such as IC 224. Circuit 424 implements at least two IC contacts 432 and 433, suitable for coupling to antenna segments such as antenna segments 226/228 in FIG. 2. When two IC contacts form the signal input from and signal return to an antenna they are often referred-to as an antenna port. IC contacts 432 and 433 may be made in any suitable way, such as from electrically-conductive pads, bumps, or similar. In some embodiments circuit 424 implements more than two IC contacts, especially when configured with multiple antenna ports and/or to couple to multiple antennas.

Circuit 424 includes signal-routing section 435 which may include signal wiring, signal-routing busses, receive/transmit switches, and similar that can route signals between the components of circuit 424. IC contacts 432/433 may couple galvanically, capacitively, and/or inductively to signal-routing section 435. For example, optional capacitors 436 and/or 438 may capacitively couple IC contacts 432/433 to signal-routing section 435, thereby galvanically decoupling IC contacts 432/433 from signal-routing section 435 and other components of circuit 424.

Capacitive coupling (and the resultant galvanic decoupling) between IC contacts 432 and/or 433 and components of circuit 424 is desirable in certain situations. For example, in some RFID tag embodiments IC contacts 432 and 433 may galvanically connect to terminals of a tuning loop on the tag. In these embodiments, galvanically decoupling IC contact 432 from IC contact 433 may prevent the formation of a DC short circuit between the IC contacts through the tuning loop.

Capacitors 436/438 may be implemented within circuit 424 and/or partly or completely external to circuit 424. For example, a dielectric or insulating layer on the surface of the IC containing circuit 424 may serve as the dielectric in capacitor 436 and/or capacitor 438. As another example, a dielectric or insulating layer on the surface of a tag substrate (e.g., inlay 222 or strap substrate 254) may serve as the dielectric in capacitors 436/438. Metallic or conductive layers positioned on both sides of the dielectric layer (i.e., between the dielectric layer and the IC and between the dielectric layer and the tag substrate) may then serve as terminals of the capacitors 436/438. The conductive layers may include IC contacts (e.g., IC contacts 432/433), antenna segments (e.g., antenna segments 226/228), or any other suitable conductive layers.

Circuit 424 includes a rectifier and PMU (Power Management Unit) 441 that harvests energy from the RF signal incident on antenna segments 226/228 to power the circuits of IC 424 during either or both reader-to-tag (R→T) and tag-to-reader (T→R) intervals. Rectifier and PMU 441 may be implemented in any way known in the art, and may include one or more components configured to convert an alternating-current (AC) or time-varying signal into a direct-current (DC) or substantially time-invariant signal.

Circuit 424 also includes a demodulator 442, a processing block 444, a memory 450, and a modulator 446. Demodulator 442 demodulates the RF signal received via IC contacts 432/433, and may be implemented in any suitable way, for example using a slicer, an amplifier, and other similar components. Processing block 444 receives the output from demodulator 442, performs operations such as command decoding, memory interfacing, and other related operations, and may generate an output signal for transmission. Processing block 444 may be implemented in any suitable way, for example by combinations of one or more of a processor, memory, decoder, encoder, and other similar components. Memory 450 stores data 452, and may be at least partly implemented as permanent or semi-permanent memory such as nonvolatile memory (NVM), EEPROM, ROM, or other memory types configured to retain data 452 even when circuit 424 does not have power. Processing block 444 may be configured to read data from and/or write data to memory 450.

Modulator 446 generates a modulated signal from the output signal generated by processing block 444. In one embodiment, modulator 446 generates the modulated signal by driving the load presented by antenna segment(s) coupled to IC contacts 432/433 to form a backscatter signal as described above. In another embodiment, modulator 446 includes and/or uses a transmitter to generate and transmit the modulated signal via antenna segment(s) coupled to IC contacts 432/433. Modulator 446 may be implemented in any suitable way, for example using a switch, driver, amplifier, and other similar components. Demodulator 442 and modulator 446 may be separate components, combined in a single transceiver circuit, and/or part of processing block 444.

In some embodiments, particularly in those with more than one antenna port, circuit 424 may contain multiple demodulators, rectifiers, PMUs, modulators, processing blocks, and/or memories.

FIG. 5A shows version 524-A of components of circuit 424 of FIG. 4, further modified to emphasize a signal operation during a R→T interval (e.g., time interval 312 of FIG. 3). During the R→T interval, demodulator 442 demodulates an RF signal received from IC contacts 432/433. The demodulated signal is provided to processing block 444 as C_IN, which in some embodiments may include a received stream of symbols. Rectifier and PMU 441 may be active, for example harvesting power from an incident RF waveform and providing power to demodulator 442, processing block 444, and other circuit components. During the R→T interval, modulator 446 is not actively modulating a signal, and in fact may be decoupled from the RF signal. For example, signal routing section 435 may be configured to decouple modulator 446 from the RF signal, or an impedance of modulator 446 may be adjusted to decouple it from the RF signal.

FIG. 5B shows version 524-B of components of circuit 424 of FIG. 4, further modified to emphasize a signal operation during a T→R interval (e.g., time interval 326 of FIG. 3). During the T→R interval, processing block 444 outputs a signal C_OUT, which may include a stream of symbols for transmission. Modulator 446 then generates a modulated signal from C_OUT and sends the modulated signal via antenna segment(s) coupled to IC contacts 432/433, as described above. During the T→R interval, rectifier and PMU 441 may be active, while demodulator 442 may not be actively demodulating a signal. In some embodiments, demodulator 442 may be decoupled from the RF signal during the T→R interval. For example, signal routing section 435 may be configured to decouple demodulator 442 from the RF signal, or an impedance of demodulator 442 may be adjusted to decouple it from the RF signal.

In typical embodiments, demodulator 442 and modulator 446 are operable to demodulate and modulate signals according to a protocol, such as the Gen2 Protocol mentioned above. In embodiments where circuit 424 includes multiple demodulators modulators, and/or processing blocks, each may be configured to support different protocols or different sets of protocols. A protocol specifies, in part, symbol encodings, and may include a set of modulations, rates, timings, or any other parameter associated with data communications. A protocol can be a variant of an internationally ratified protocol such as the Gen2 Protocol, for example including fewer or additional commands than the ratified protocol calls for, and so on. In some instances, additional commands may sometimes be called custom commands.

Digital logic in circuits such as RFID tag ICs generally use logic levels based on supply voltage levels. For example, a circuit block that has a supply voltage $V_{dd}$ may use the voltage $V_{dd}$ to represent a logical "1" and a voltage 0 to represent a logical "0". In some embodiments, digital logic circuits may have complementary input or output signals. Two digital signals are complementary when each has the opposite logical state of the other. For example, if one of two complementary digital input signals is a logical "1", the other of the two complementary digital inputs signals will be a logical "0".

In some situations, different circuit blocks within the same IC may use different supply voltages. For example, a first circuit block configured to operate at relatively low power may operate at a lower supply voltage than a second circuit block. In these situations, the first circuit block, which operates at the lower supply voltage, may not be able to directly drive the second circuit block, which is operating at the higher supply voltage. To address this issue, a level shifter circuit can be used to connect the first and second circuit blocks. A level shifter circuit converts digital signals between two different voltage levels. For example, a level shifter circuit can convert a digital signal with a high logic level at the lower supply voltage to a digital signal with a high logic level at the higher supply voltage, thereby enabling the first circuit block to drive the second circuit block.

Figure 6:
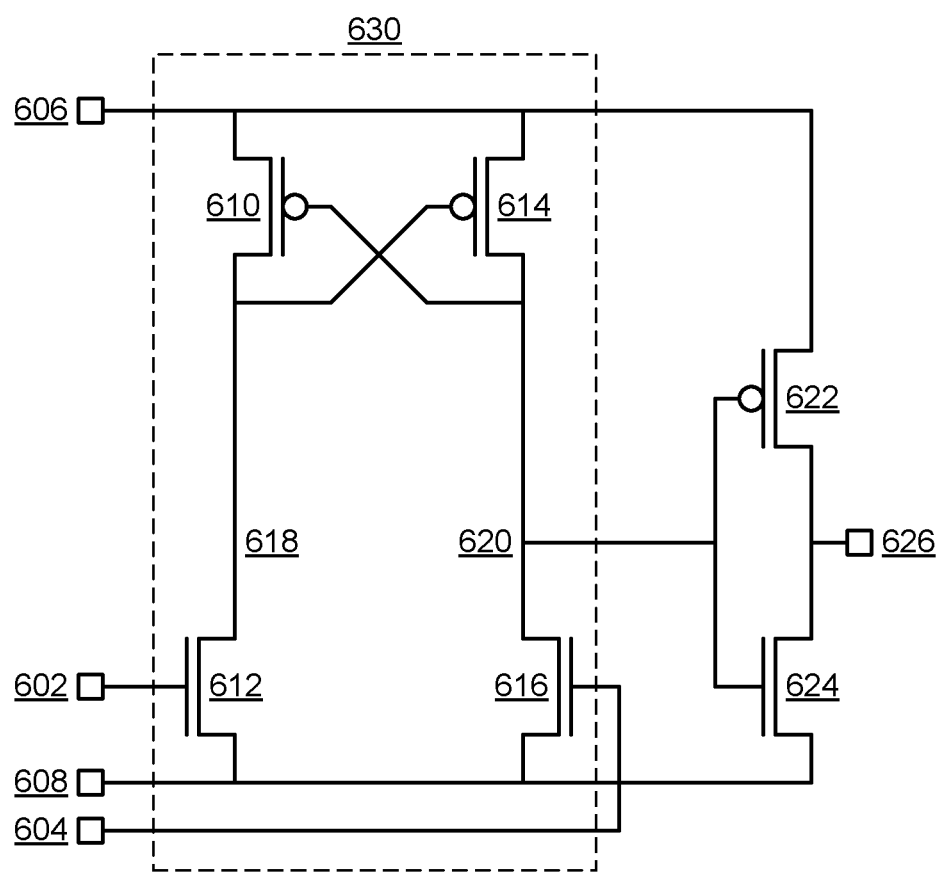
FIG. 6 depicts a level shifter circuit that may be used in an RFID tag IC.

FIG. 6 depicts a level shifter circuit 600 that may be used in an RFID tag IC. Level shifter circuit 600 has complementary inputs 602 and 604 and an output 626. Level shifter circuit 600 is coupled to supply voltage 606 and a reference potential (or ground) 608. Level shifter circuit 600 includes PMOS latch transistors 610 and 614 coupled to NMOS transistors 612 and 616 at nodes 618 and 620, respectively, forming a latch circuit 630. Inputs 602 and 604 drive the gates of NMOS transistors 612 and 616. Supply voltage 606 is coupled to the sources of PMOS latch transistors 610 and 614, and the sources of NMOS transistors 612 and 616 are coupled to reference potential 608. Node 620 is coupled to an optional inverter circuit including PMOS transistor 622 and NMOS transistor 624, which has output 626.

When a high logic signal is applied to input 602 (and a complementary low logic signal is applied to input 604), NMOS transistor 612 turns on and attempts to force node 618 to reference potential 608. Node 618 then turns PMOS latch transistor 614 on, forcing node 620 to supply voltage 606 and PMOS latch transistor 610 to turn off. If the optional inverter circuit is present, the supply voltage 606 at node 620 is then inverted by transistors 622 and 624, driving output 626 to reference potential 608. When a high logic signal is applied to input 604 (and a complementary low logic signal is applied to input 602), the opposite happens, and output 626 is driven to supply voltage 606. Accordingly, level shifter circuit 600 can generate a high logic signal at supply voltage 606 from a high logic signal at input 604, which may have a voltage that differs from supply voltage 606.

In general, transistors 610-616 should be designed such that NMOS transistors 612 and 616 can force PMOS latch transistors 610 and 614 to turn on and off. This may be done by, for example, making the channels of PMOS latch transistors 610 and 614 long and narrow. However, if the high logic signal at inputs 602/604 has a voltage that is significantly lower than supply voltage 606, and/or is close to or lower than the threshold voltages of NMOS transistors 612/616, then the high logic input signal may not be able to turn NMOS transistors 612/616 on enough to force PMOS latch transistors 610/614 to switch. Furthermore, NMOS transistors 612/616 can pull nodes 618/620 down (that is, couple nodes 618/620 to reference potential 608) but cannot pull nodes 618/620 up (that is, drive them to supply voltage 606). Accordingly, the combination of a potentially weak pull-down effect and inability to pull up may make it difficult for NMOS transistors 612/616 to change the states of PMOS latch transistors 610/614.

Figure 7:
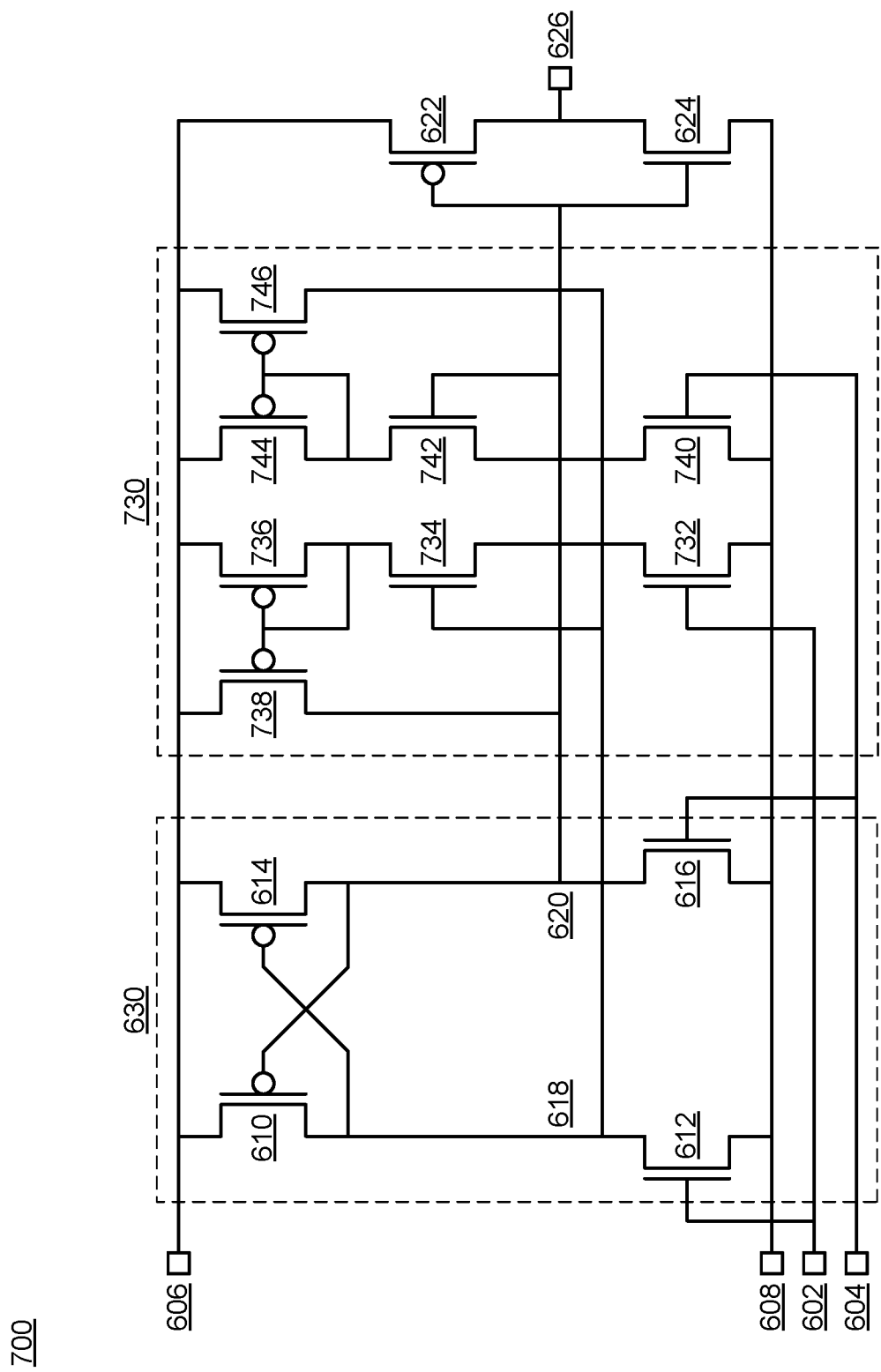
FIGS. 7-10 depict level shifter circuits with self-gated transition amplifier circuits that may be used in RFID tag ICs, according to embodiments.

To address this issue, additional circuitry may be added to a level shifter to facilitate the switching of PMOS latch transistors. FIG. 7 depicts a first level shifter circuit 700 with a self-gated transition amplifier circuit that may be used in an RFID tag IC, according to embodiments. Level shifter circuit 700 is similar in part to level shifter circuit 600, with similarly numbered elements behaving similarly. For example, level shifter circuit 700 has complementary inputs 602 and 604 and an output 626, is coupled to supply voltage 606 and a reference potential 608, and has latch circuit 630 that includes PMOS latch transistors 610 and 614 coupled to NMOS transistors 612 and 616 at nodes 618 and 620, respectively. Level shifter circuit 700 also includes an optional inverter circuit coupled to node 620 and having PMOS transistor 622, NMOS transistor 624, and output 626.

Level shifter circuit 700 differs from level shifter circuit 600 in the inclusion of a self-gated transition amplifier circuit 730 in parallel with latch circuit 630. Circuit 730 includes two current mirror structures parallel to each other and to the current paths of PMOS latch transistors 610 and 614. One of the current mirror structures is formed by NMOS transistors 732/734 and PMOS transistors 736/738 and is coupled to input 602 and node 618. The other current mirror structure is formed by NMOS transistors 740/742 and PMOS transistors 744/746 and is coupled to input 604, node 620 and the optional inverter circuit.

During operation of the level shifter circuit 700, circuit 730 assists in changing the states of PMOS latch transistors 610/614 by providing a pull-up effect complementary to the pull-down effect of NMOS transistors 612/616. For example, suppose that initially node 618 is at supply voltage 606 and node 620 is at reference potential 608, meaning that PMOS latch transistor 610 is on and PMOS latch transistor 614 is off. Subsequently, high and low logic signals may then be received at inputs 602 and 604, respectively, which would cause NMOS transistors 612/616 to attempt to change the voltages at nodes 618/620 and force PMOS latch transistors 610/614 to switch states. The high logic signal at input 602 causes NMOS transistor 612 to turn on and attempt to pull node 618 down to the reference potential 608. At the same time, the high logic signal at input 602 causes NMOS transistor 732 to turn on. NMOS transistor 734 is also on, because its gate is coupled to node 618 (which is currently at supply voltage 606). When both NMOS transistors 732 and 734 are on, the gate of PMOS transistor 736 becomes coupled to reference potential 608. Accordingly, PMOS transistor 736 then turns on, generating an input current flow through transistors 732, 734, and 736. In effect, NMOS transistors 732 and 734 can be considered as "gating" or "switching" the input current flow through PMOS transistor 736.

When PMOS transistor 736 turns on, PMOS transistor 738, whose gate is tied to the gate and drain of PMOS transistor 736, also turns on, generating an output current at the drain of PMOS transistor 738. Node 620 is coupled to the drains of PMOS transistor 738 and NMOS transistor 616. When PMOS transistor 738 turns on and NMOS transistor 616 turns off (due to the low logic signal at input 604), the output current through PMOS transistor 738 causes node 620 to be pulled up or increased to supply voltage 606. The combined pull-down of node 618 to the reference potential 608 by transistor 612 and the pull-up of node 620 to the supply voltage 606 facilitates the forcing of PMOS latch transistor 610 off and PMOS latch transistor 614 on. Once the PMOS latch transistors 610 and 614 have turned off and on, respectively, node 618 drops to the reference potential 608 (due to NMOS transistor 612 coupling node 618 to the reference potential 608) and turns NMOS transistor 734 off, interrupting the input current flow through transistors 732, 734, and 736 and thereby interrupting the output current at the drain of transistor 738. This "self-gating" effect ensures that current flow through transistors 732, 734, 736, and 738 only occur when PMOS latch transistors 610/614 are changing state or transitioning, thereby reducing power consumption.

The other current mirror structure formed by NMOS transistors 740/742 and PMOS transistors 744/746 functions in an analogous way. For example, suppose that initially node 618 is at reference potential 608 and node 620 is at supply voltage 606, meaning that PMOS latch transistor 610 is off and PMOS latch transistor 614 is on. Subsequently, low and high logic signals are then received at inputs 602 and 604, respectively, which would cause NMOS transistors 612/616 to attempt to change the voltages at nodes 618/620 and force PMOS latch transistors 610/614 to switch states. The high logic signal at input 604 causes (a) NMOS transistor 616 to turn on and attempt to pull node 620 down to the reference potential 608 and (b) NMOS transistor 740 to turn on. NMOS transistor 742 is also on, because its gate is coupled to node 620 (which is currently at supply voltage 606). When both NMOS transistors 740 and 742 are on, the gate of PMOS transistor 744 becomes coupled to reference potential 608. Accordingly, PMOS transistor 744 then turns on, generating an input current flow through transistors 740, 742, and 744. As with the other current mirror structure described above, NMOS transistors 740 and 742 can be considered as "gating" or "switching" the input current flow through PMOS transistor 744.

When PMOS transistor 744 turns on, PMOS transistor 746, whose gate is tied to the gate and drain of PMOS transistor 744, also turns on, generating an output current at the drain of PMOS transistor 746. Node 618 is coupled to the drains of PMOS transistor 746 and NMOS transistor 612. When PMOS transistor 746 turns on and NMOS transistor 612 turns off (due to the low logic signal at input 602), the output current at the drain of PMOS transistor 746 causes node 618 to be pulled up or increased to supply voltage 606. The combined pull-down of node 620 to the reference potential 608 by transistor 616 and the pull-up of node 618 to the supply voltage 606 facilitates the forcing of PMOS latch transistor 610 on and PMOS latch transistor 614 off. Once the PMOS latch transistors 610 and 614 have turned on and off, respectively, node 620 drops to the reference potential 608 (due to NMOS transistor 616 coupling node 620 to the reference potential 608) and "self-gates" NMOS transistor 742. This self-gating of NMOS transistor 742 turns it off, interrupting the current flow through transistors 740, 742, and 744 and also interrupting the output current at the drain of transistor 746, thereby limiting power consumption as described above.

Figure 8:
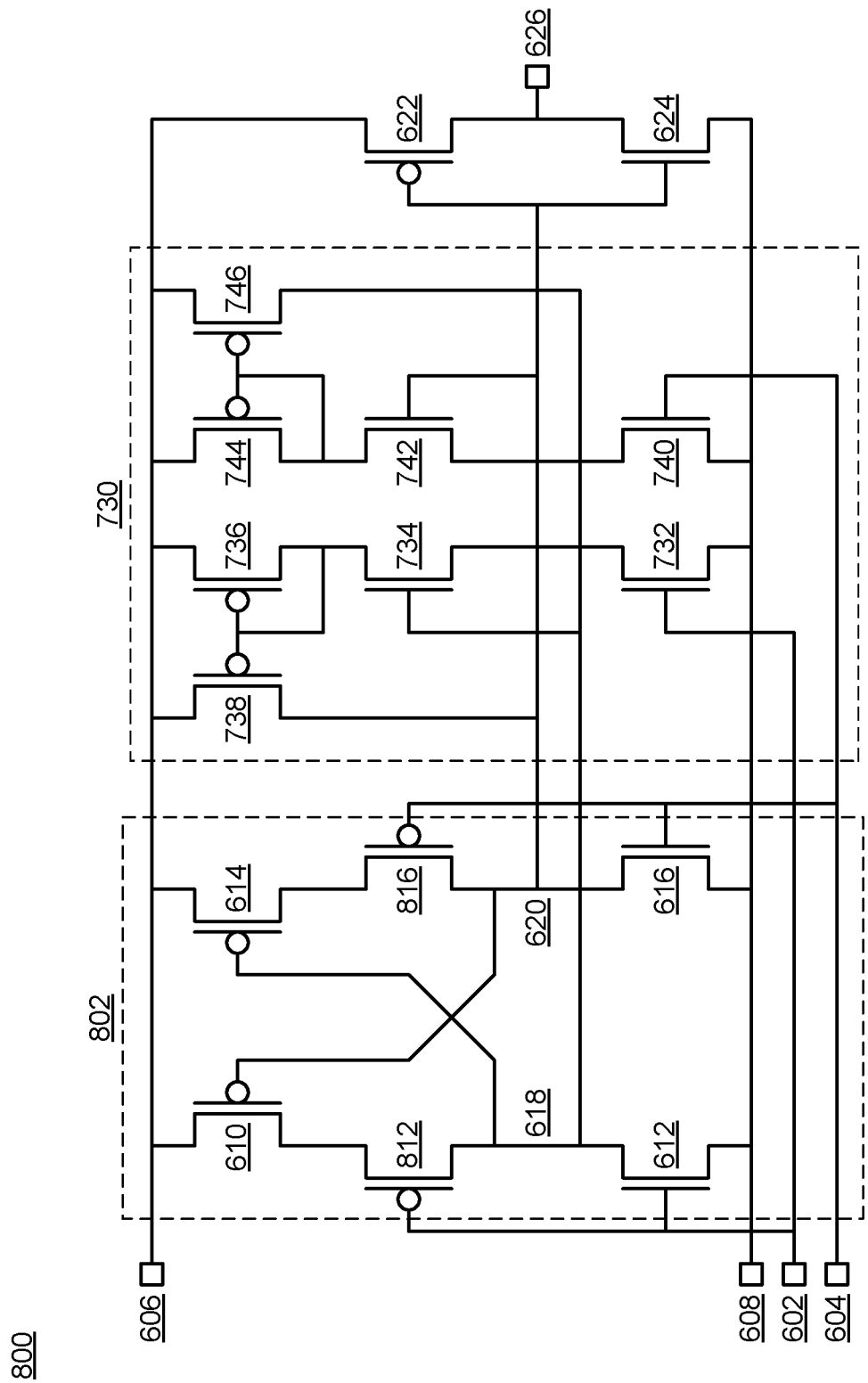

FIG. 8 depicts a second level shifter circuit 800 with a self-gated transition amplifier circuit 730 that may be used in an RFID tag IC, according to embodiments. Level shifter circuit 800 is similar to level shifter circuit 700, with similarly numbered elements operating similarly. Level shifter circuit 800 differs from level shifter circuit 700 in that latch circuit 802 includes PMOS transistors 812 and 816, disposed between PMOS latch transistors 610/614 and nodes 618/620. The gates of PMOS transistors 812 and 816 are coupled to inputs 602 and 604, respectively, and help reduce the strength of PMOS latch transistors 610/614 during switching. For example, when a high logic signal is received at input 602, the high logic signal turns NMOS transistor 612 on, coupling node 618 to reference potential 608, and also turns PMOS transistor 812 partially off, to help force PMOS latch transistors 610/614 to change states. The inclusion of PMOS transistors 812 and 816 may allow latch circuit 802 and therefore level shifter circuit 800 to provide correct level shifting over a wider range of supply voltages than level shifter circuit 700.

Figure 9:
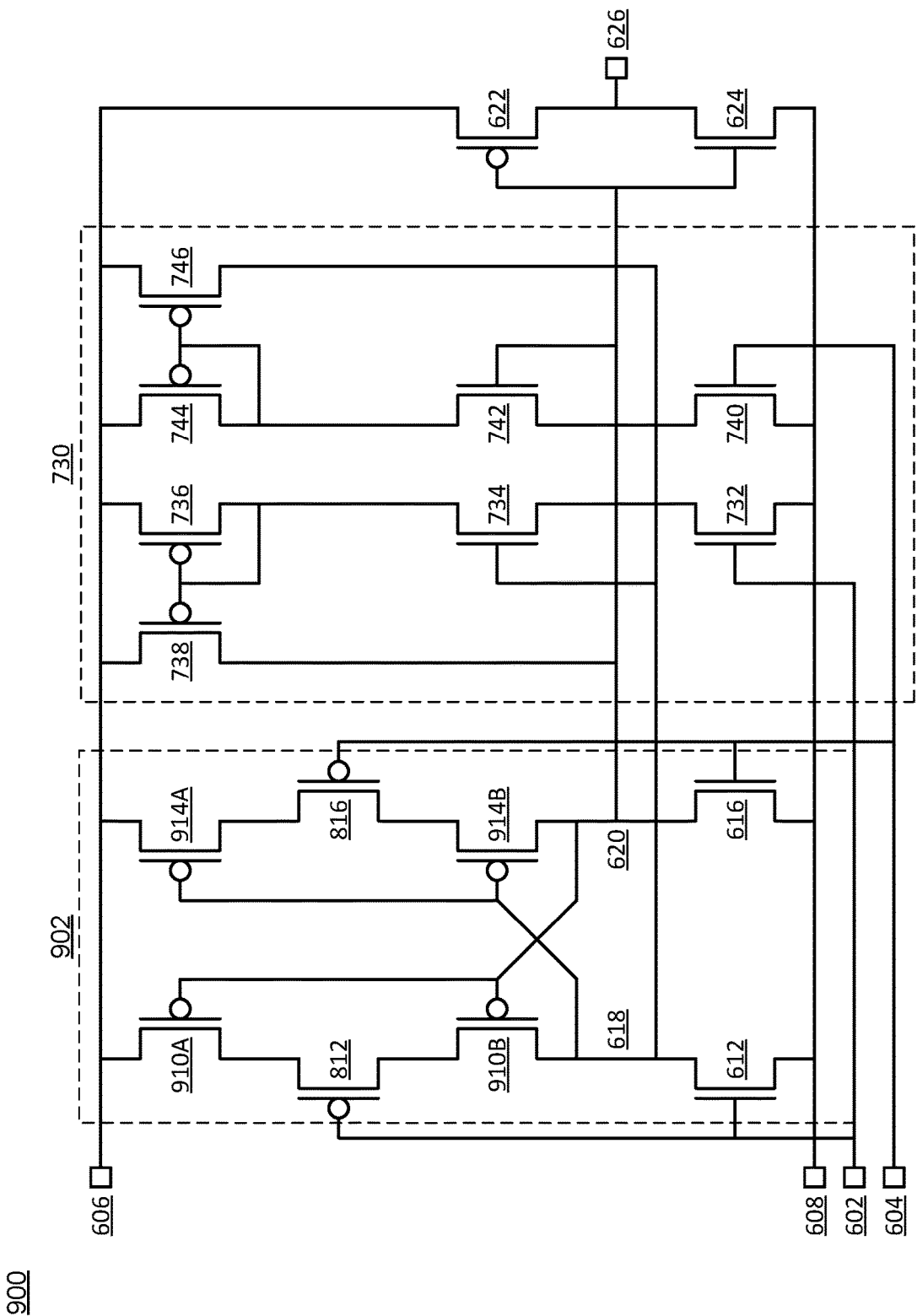

FIG. 9 depicts a third level shifter circuit 900 with a self-gated transition amplifier circuit 730 that may be used in an RFID tag IC, according to embodiments. Level shifter circuit 900 includes a latch circuit 902 that is similar to latch circuit 802 in level shifter circuit 800, with similarly numbered elements operating similarly. Latch circuit 902 differs from latch circuit 802 in that each of the PMOS latch transistors have been divided into two segments. For example, PMOS latch transistor 610 has been divided into PMOS transistors 910A and 910B, while PMOS latch transistor 614 has been divided into PMOS transistors 914A and 914B. This division may facilitate circuit design and layout in certain circumstances without affecting the performance of the level shifter circuit.

Figure 10:
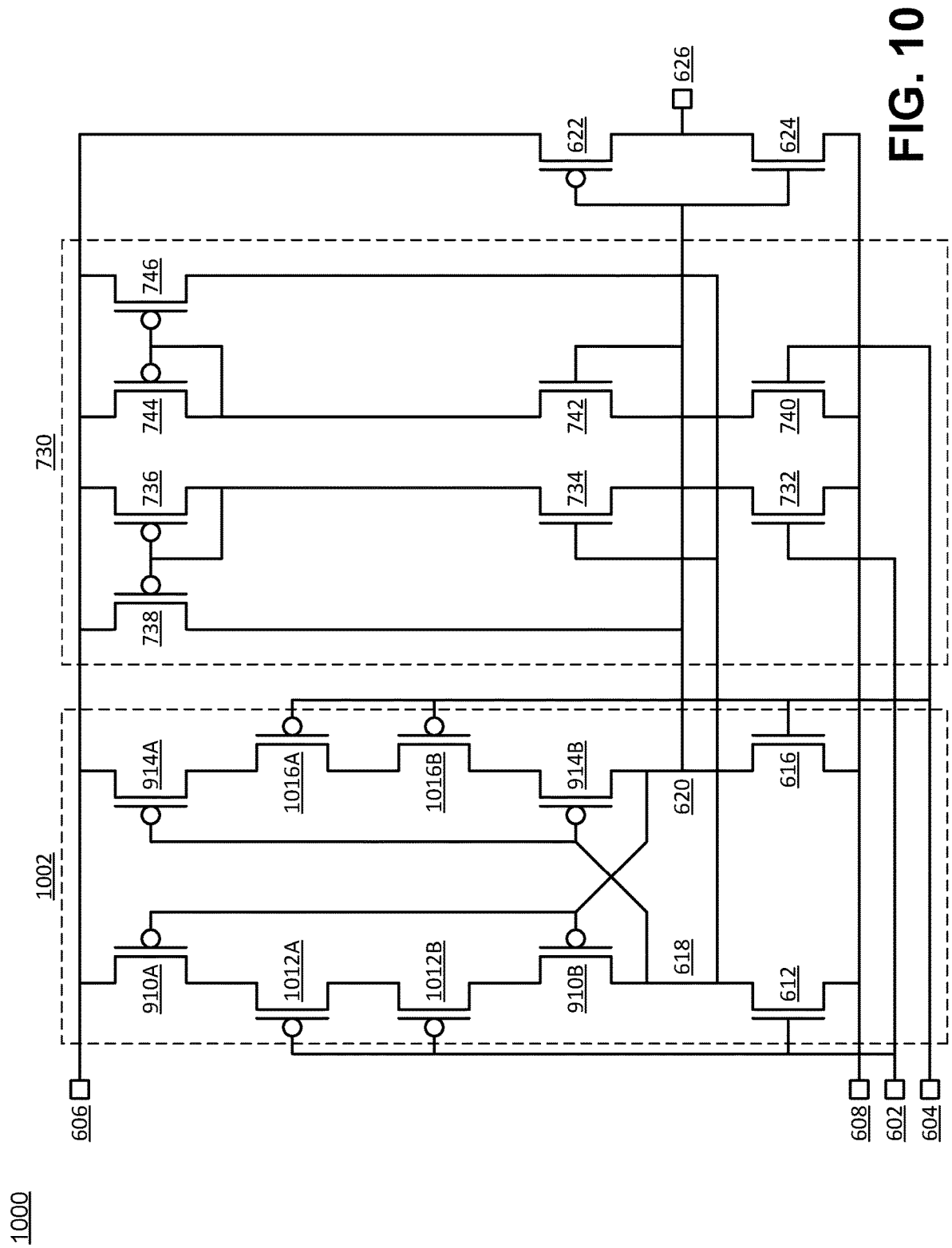

FIG. 10 depicts a fourth level shifter circuit 1000 with a self-gated transition amplifier circuit 730 that may be used in an RFID tag IC, according to embodiments. Level shifter circuit 1000 includes a latch circuit 1002 that is similar to latch circuit 902, with similarly numbered elements operating similarly. Latch circuit 1002 differs from latch circuit 902 in that PMOS transistors 812 and 816 have also been divided into two segments (PMOS transistors 1012A/1012B and 1016A/1016B, respectively) to facilitate circuit design and layout in certain circumstances without affecting the performance of the level shifter circuit.

Figure 11:
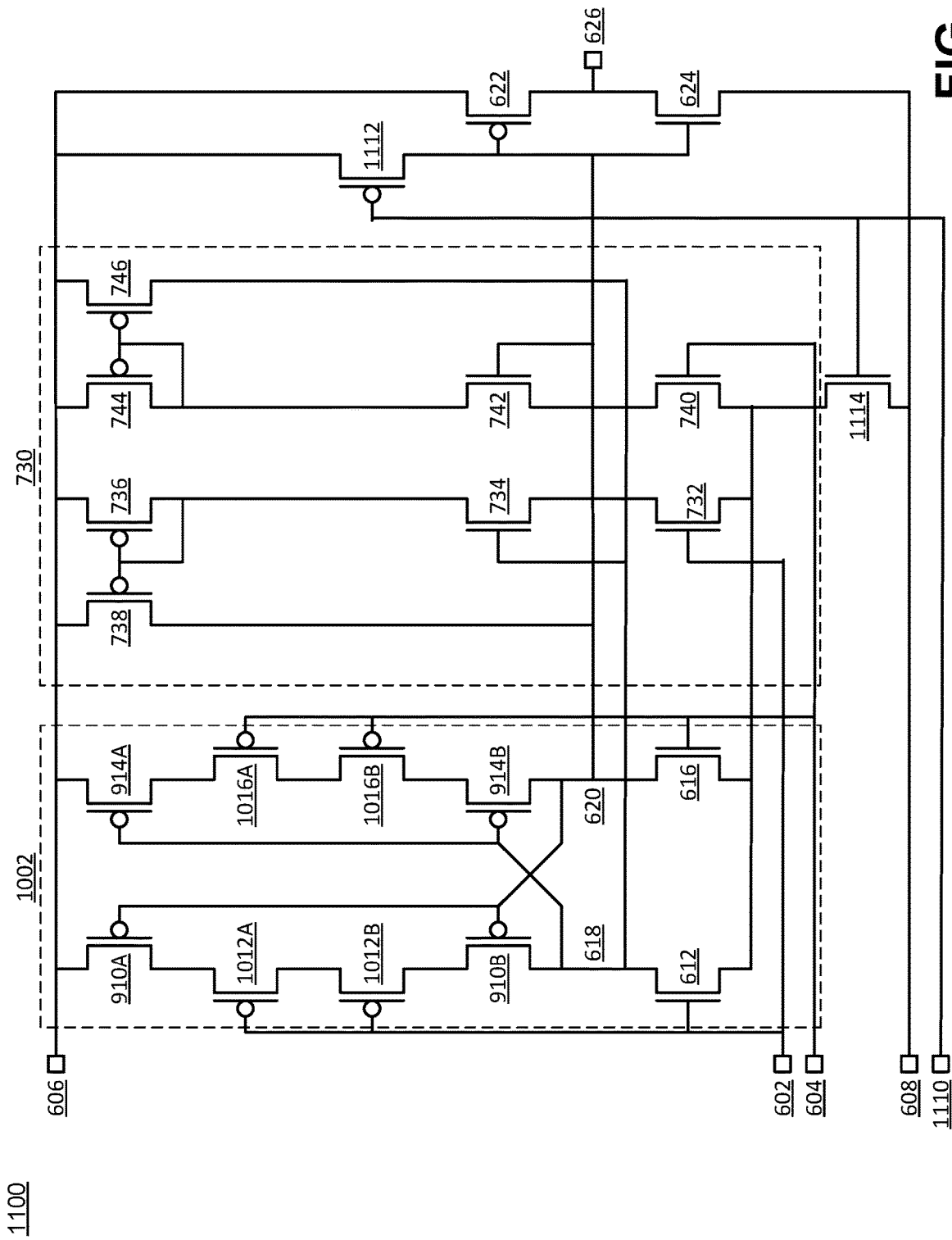
FIG. 11 depicts a resettable level shifter circuit with a self-gated transition amplifier circuit that may be used in an RFID tag IC, according to embodiments.

FIG. 11 depicts a resettable level shifter circuit 1100 with a self-gated transition amplifier circuit 730 that may be used in an RFID tag IC, according to embodiments. Level shifter circuit 1100 is similar to level shifter circuit 1000, with similarly numbered elements operating similarly. Level shifter circuit 1100 differs from level shifter circuit 1000 by the inclusion of a reset input 1110 coupled to the gates of reset transistors 1112 and 1114. PMOS reset transistor 1112 couples node 620 to the supply voltage 606, while NMOS reset transistor 1114 couples reference voltage 608 to the rest of the level shifter circuit 1100. When a high logic signal at a voltage level equal to supply voltage 606 is received at reset input 1110, transistor 1112 turns off while transistor 1114 turns on, allowing the level shifter circuit 1100 to operate as described above. When a low logic signal is received at reset input 1110, transistor 1112 turns on while transistor 1114 turns off. This decouples the level shifter circuit 1100 from the reference potential 608 and drives node 620 to the supply voltage 606 and output 626 to reference potential 608, thereby placing the level shifter circuit 1100 into a known state independent of the logic signal values at inputs 602 and 604.

In some embodiments, a level shifter circuit with a self-gated transition amplifier circuit may also (or instead) be configured with a set input different from reset input 1110. The set input may be configured to drive the level shifter circuit output to the supply voltage instead of a reference potential, independent of the logic signal values at the level shifter circuit input. A set input may be implemented by either adding another inverter stage to the output or by altering the configuration of level shifter circuit 1100 such that a PMOS transistor connects the latch circuit 1002 and the amplifier circuit 730 to the supply voltage 606 (as opposed to NMOS transistor 1114 coupling circuits 1002/730 to reference potential 608) and an NMOS transistor couples node 620 to reference potential 608 (as opposed to PMOS transistor 1112 coupling node 620 to the supply voltage 606).

While FIG. 11 shows a resettable version of level shifter circuit 1000, such functionality may be added to any other level shifter circuit. For example, set/reset functionality may be added to level shifter circuits 700, 800, and/or 900.

In some embodiments, level shifter circuits with self-gated transition amplifier circuits may be configured with complementary outputs. For example, circuits 700, 800, 900, 1000, and/or 1100 may be configured with output 626 as one of the complementary outputs and node 618 (coupled to another inverter if appropriate) as another one of the complementary outputs.

While the above description recites circuits having certain PMOS and NMOS transistors in certain configurations, in other embodiments other circuit configurations or devices may be used. For example, other devices configured to perform switching or gating functionality may be used instead of transistors. PMOS transistors in the circuit configurations described herein may be replaced with other, suitably configured non-PMOS devices, and likewise NMOS transistors in the circuit configurations described herein may be replaced with other, suitably configured non-NMOS devices.

According to one example, a level shifter circuit configured to convert a first digital input signal having a first high logic level to a digital output signal having a second high logic level substantially higher than the first high logic level is provided. The level shifter circuit includes a latch circuit and a current mirror circuit. The latch circuit may be at least partly controlled by the first digital input signal and includes first and second PMOS transistors. A gate of the first PMOS transistor may be coupled to a drain of the second PMOS transistor and a gate of the second PMOS transistor may be coupled to a drain of the first PMOS transistor. The current mirror circuit may be at least partly controlled by the first digital input signal and may include third and fourth PMOS transistors and a first NMOS transistor. The current mirror circuit may be configured to receive an input current coupled to a drain of the third PMOS transistor and to provide an output current at a drain of the fourth PMOS transistor and the drain of the first PMOS transistor. The first NMOS transistor may be configured to switch the input current. A gate of the first NMOS transistor may be coupled to the drain of the second PMOS transistor, and the drain of the first PMOS transistor or the drain of the second PMOS transistor may be used to generate the digital output signal.

In some embodiments, the latch circuit is in parallel with the current mirror circuit. The level shifter circuit may further include two complementary inputs, where one of the complementary inputs may be configured to receive the first digital input signal and the other complementary input may be configured to receive a second digital input signal complementary to the first digital input signal. The latch circuit may include a second NMOS transistor coupled to the drain of the second PMOS transistor, the current mirror circuit may include a third NMOS transistor coupled to a source of the first NMOS transistor and configured to switch the input current, and a first one of the complementary inputs may be coupled to a gate of the second NMOS transistor and a gate of the third NMOS transistor.

In other embodiments, the latch circuit may further include a fifth PMOS transistor, a gate of the fifth PMOS transistor may be coupled to the first complementary input, the gate of the first PMOS transistor may be coupled to the drain of the second PMOS transistor through the fifth PMOS transistor, and the gate of the first NMOS transistor may be coupled to the drain of the second PMOS transistor through the fifth PMOS transistor. The level shifter circuit may further include a set input and/or a reset input, and may be configured to, independent of the first digital input signal, force the digital output signal to the second high logic level upon receiving a set signal on the set input and force the digital output signal to a low logic level upon receiving a reset signal on the reset input. The level shifter circuit may further include an inverter circuit with an input coupled to and configured to receive a signal from the drain of the first PMOS transistor or the drain of the second PMOS transistor and an output configured to generate the digital output signal from the received signal. In some embodiments, the level shifter circuit may be implemented in an integrated circuit for an RFID tag.

According to another example, a level shifter circuit configured to convert a digital input signal having a first high logic level to a digital output signal having a second high logic level substantially higher than the first high logic level is provided. The level shifter circuit may include a PMOS latch circuit and a first current mirror circuit. The PMOS latch circuit may be configured to receive the digital input signal and may include first and second latch outputs. The first current mirror circuit may have a first mirror input and a first mirror output. The first mirror input may be partly gated by a first switch having a first control input. The first mirror output may be coupled to the first latch output. The first control input may be coupled to the first or the second latch outputs. The digital output signal may be generated from the first and/or the second latch outputs.

In some embodiments, the PMOS latch circuit may be in parallel with the current mirror circuit. The level shifter circuit may further include a second current mirror circuit having a second mirror input and a second mirror output, where the second mirror input is at least partly gated by a second switch having a second control input, the second mirror output is coupled to the second latch output, and the first and second control inputs are each coupled to a different one of the first and second latch outputs. The digital input signal may include two complementary signals, where the first current mirror circuit may be configured to receive one of the complementary signals and the second current mirror circuit may be configure to receive the other one of the complementary signals. The digital output signal may include two complementary signals, where one of the complementary signals is generated from the first latch output and the first mirror output and the other complementary signal is generated from the second latch output and the second mirror output.

In some embodiments, the level shifter circuit may include a set input and/or a reset input, and may be configured to, independent of the digital input signal, force the digital output signal to the second high logic level upon receiving a set signal on the set input and force the digital output signal to a low logic level upon receiving a reset signal on the reset input. The current mirror circuit may include a PMOS current mirror, and the level shifter circuit may be implemented in an integrated circuit for an RFID tag.

According to yet another example, a method to convert a digital input signal having a first high logic level to a digital output signal having a second high logic level substantially higher than the first high logic level is provided. The method may include providing the digital input signal to a PMOS latch circuit configured to transition between providing the digital output signal having the second high logic level and providing a digital output signal having a low logic level. The method may further include using a PMOS current mirror circuit to assist the PMOS latch circuit during the transition. The current mirror circuit may be parallel to the PMOS latch circuit and may be configured to conduct substantial current only during the transition and otherwise not conductive substantial current. When conducting substantial current, the current mirror circuit may be configured to use the substantial current to assist the PMOS latch circuit to transition by providing the second high logic level on a first side of the PMOS latch circuit.

In some embodiments, the method may include at least partly gating the current mirror circuit based on a voltage on a second side of the PMOS latch circuit opposite the first side. The method may further include at least partly gating the current mirror circuit based on the digital input signal. The method may further include providing a set signal independent of the digital input signal to force the digital output signal to the second high logic level and/or providing a reset signal independent of the digital input signal to force the digital output signal to a low logic level. In some embodiments, the method may be implemented in an integrated circuit for an RFID tag.

The foregoing detailed description has set forth various embodiments of the devices and/or processes via the use of block diagrams and/or examples. Insofar as such block diagrams and/or examples contain one or more functions and/or aspects, each function and/or aspect within such block diagrams or examples may be implemented individually and/or collectively, by a wide range of hardware, software, firmware, or virtually any combination thereof. Some aspects of the embodiments disclosed herein, in whole or in part, may be equivalently implemented employing integrated circuits, as one or more computer programs running on one or more computers (e.g., as one or more programs running on one or more computer systems), as one or more programs running on one or more processors (e.g. as one or more programs running on one or more microprocessors), as firmware, or as virtually any combination thereof), and that designing the circuitry and/or writing the code for the software and/or firmware would be well within the skill of one of skill in the art in light of this disclosure.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, configurations, tags, RFICs, readers, systems, and the like, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). If a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). Any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

For any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. All language such as "up to," "at least," "greater than," "less than," and the like include the number recited and refer to ranges which can be subsequently broken down into subranges as discussed above. Finally, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

I claim:

1. A level shifter circuit configured to convert a first digital input signal having a first high logic level to a digital output signal having a second high logic level substantially higher than the first high logic level, the level shifter circuit comprising:
 a latch circuit at least partly controlled by the first digital input signal and comprising first and second PMOS transistors, wherein a gate of the first PMOS transistor is coupled to a drain of the second PMOS transistor and a gate of the second PMOS transistor is coupled to a drain of the first PMOS transistor;
 a current mirror circuit at least partly controlled by the first digital input signal and comprising third and fourth PMOS transistors and a first NMOS transistor, wherein:
  the current mirror circuit is configured to receive an input current coupled to a drain of the third PMOS transistor and to provide an output current at a drain of the fourth PMOS transistor and the drain of the first PMOS transistor,
  the first NMOS transistor is configured to switch the input current,
  a gate of the first NMOS transistor is coupled to the drain of the second PMOS transistor, and
  one of the drain of the first PMOS transistor and the drain of the second PMOS transistor is used to generate the digital output signal;
 two complementary inputs, wherein:
  one of the complementary inputs is configured to receive the first digital input signal,
  the other of the complementary inputs is configured to receive a second digital input signal complementary to the first digital input signal,
  the latch circuit includes a second NMOS transistor coupled to the drain of the second PMOS transistor,
  the current mirror circuit includes a third NMOS transistor coupled to a source of the first NMOS transistor and also configured to switch the input current, and
  a first one of the complementary inputs is coupled to a gate of the second NMOS transistor and a gate of the third NMOS transistor; and
 wherein
  the latch circuit further includes a fifth PMOS transistor,
  a gate of the fifth PMOS transistor is coupled to the first one of the complementary inputs,
  the gate of the first PMOS transistor is coupled to the drain of the second PMOS transistor through the fifth PMOS transistor, and
  the gate of the first NMOS transistor is coupled to the drain of the second PMOS transistor through the fifth PMOS transistor.

2. The level shifter circuit of claim 1, wherein the latch circuit is in parallel with the current mirror circuit.

3. The level shifter circuit of claim 1, further comprising at least one of a set input and a reset input and configured to, independent of the first digital input signal:
 upon receiving a set signal on the set input, force the digital output signal to the second high logic level, and
 upon receiving a reset signal on the reset input, force the digital output signal to a low logic level.

4. The level shifter circuit of claim 1, further comprising an inverter circuit having:
 an input coupled to and configured to receive a signal from one of the drain of the first PMOS transistor and the drain of the second PMOS transistor, and
 an output configured to generate the digital output signal from the received signal.

5. The level shifter circuit of claim 1, implemented in an integrated circuit for a Radio Frequency Identification (RFID) tag.

6. A level shifter circuit configured to convert a digital input signal having a first high logic level to a digital output signal having a second high logic level substantially higher than the first high logic level, the level shifter circuit comprising:
 a PMOS latch circuit configured to receive the digital input signal and having first and second latch outputs;
 a first current mirror circuit having a first mirror input and a first mirror output, wherein:
  the first mirror input is at least partly gated by a first switch having a first control input,
  the first mirror output is coupled to the first latch output,
  the first control input is coupled to one of the first and second latch outputs, and
  the digital output signal is generated from at least one of the first and second latch outputs; and
 at least one of a set input and a reset input, wherein the level shifter circuit is configured to, independent of the digital input signal:
  upon receiving a set signal on the set input, force the digital output signal to the second high logic level, and
  upon receiving a reset signal on the reset input, force the digital output signal to a low logic level.

7. The level shifter circuit of claim 6, wherein the PMOS latch circuit is in parallel with the first current mirror circuit.

8. The level shifter circuit of claim 6, further comprising a second current mirror circuit having a second mirror input and a second mirror output, wherein:
 the second mirror input is at least partly gated by a second switch having a second control input,
 the second mirror output is coupled to the second latch output, and
 the first and second control inputs are each coupled to a different one of the first and second latch outputs.

9. The level shifter circuit of claim 8, wherein:
 the digital input signal includes two complementary signals,
 the first current mirror circuit is configured to receive one of the two complementary signals, and
 the second current mirror circuit is configured to receive the other one of the two complementary signals.

10. The level shifter circuit of claim 8, wherein:
the digital output signal includes two complementary signals,
one of the complementary signals is generated from the first latch output and the first mirror output, and
the other one of the two complementary signals is generated from the second latch output and the second mirror output.

11. The level shifter circuit of claim 6, wherein the current mirror circuit includes a PMOS current mirror.

12. The level shifter circuit of claim 6, implemented in an integrated circuit for a Radio Frequency Identification (RFID) tag.

13. A method to convert a digital input signal having a first high logic level to a digital output signal having a second high logic level substantially higher than the first high logic level, the method comprising:
providing the digital input signal to a PMOS latch circuit configured to transition between providing the digital output signal having the second high logic level and providing a digital output signal having a low logic level;
using a PMOS current mirror circuit to assist the PMOS latch circuit during the transition, wherein the current mirror circuit:
is parallel to the PMOS latch circuit,
is configured to conduct substantial current only during the transition and otherwise not conduct substantial current, and
when conducting substantial current, is configured to use the substantial current to assist the PMOS latch circuit to transition by providing the second high logic level on a first side of the PMOS latch circuit; and
at least one of:
providing a set signal independent of the digital input signal to force the digital output signal to the second high logic level, and
providing a reset signal independent of the digital input signal to force the digital output signal to a low logic level.

14. The method of claim 13, further comprising at least partly gating the current mirror circuit based on a voltage on a second side of the PMOS latch circuit opposite the first side.

15. The method of claim 14, further comprising at least partly gating the current mirror circuit based on the digital input signal.

16. The method of claim 13, implemented in an integrated circuit for a Radio Frequency Identification (RFID) tag.

\* \* \* \* \*